(12) United States Patent
Batra et al.

(10) Patent No.: US 6,406,954 B1
(45) Date of Patent: Jun. 18, 2002

(54) METHOD FOR FORMING OUT-DIFFUSING A DOPANT FROM THE DOPED POLYSILICON INTO THE N-TYPE AND P-TYPE DOPED PORTION

(75) Inventors: Shubneesh Batra, Boise; Luan C. Tran, Meridian; Tyler A. Lowrey, Sandpoint, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/388,559

(22) Filed: Sep. 2, 1999

(51) Int. Cl.[7] .......................................... H01L 21/8238
(52) U.S. Cl. ...................... 438/199; 438/542; 438/672
(58) Field of Search ................................. 438/199, 200, 438/208, 233, 300, 54.2, 561, 666, 672, 675, 231; 257/754

(56) References Cited

U.S. PATENT DOCUMENTS

| 4,744,861 A | * | 5/1988 | Matsunaga et al. | ......... 156/643 |
| 5,309,023 A | * | 5/1994 | Motonami et al. | ........... 257/773 |
| 5,641,991 A | * | 6/1997 | Sakoh | ........................ 257/755 |
| 5,773,358 A | * | 6/1998 | Wu et al. | .................... 438/564 |
| 6,066,894 A | * | 5/2000 | Yokozeki | ..................... 257/754 |
| 6,110,787 A | * | 8/2000 | Chan et al. | .................. 438/300 |
| 6,188,116 B1 | * | 2/2001 | Lin | ............................. 257/413 |

FOREIGN PATENT DOCUMENTS

JP           410163322 A   *  6/1998

* cited by examiner

Primary Examiner—Olik Chaudhuri
Assistant Examiner—Hoai Pham
(74) Attorney, Agent, or Firm—Wells, St. John, Roberts, Gregory & Matkin

(57) ABSTRACT

In one aspect, the invention includes a semiconductor processing method of diffusing dopant into both n-type and p-type doped regions of a semiconductive substrate. A semiconductive material is provided. The semiconductive material has a first portion and a second portion. The first portion is a p-type doped portion and the second portion is an n-type doped portion. A mask material is formed over the p-type and n-type doped portions. A first opening is formed to extend through the mask material and to the n-type doped portion. A second opening is formed to extend through the mask material and to the p-type doped portion. Conductively doped polysilicon is formed within the first and second openings. Dopant is out-diffused from the conductively-doped polysilicon and into the n-type and p-type doped portions. In another aspect, the invention includes methods of forming CMOS constructions. In yet another aspect, the invention encompasses methods of forming DRAM constructions.

19 Claims, 9 Drawing Sheets

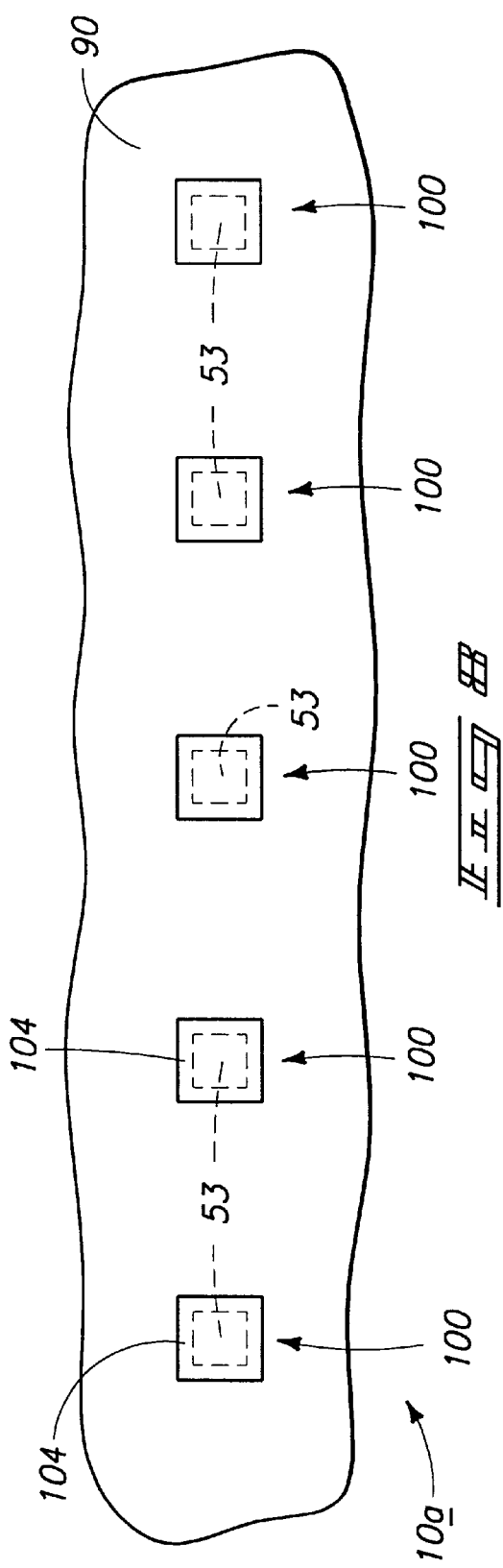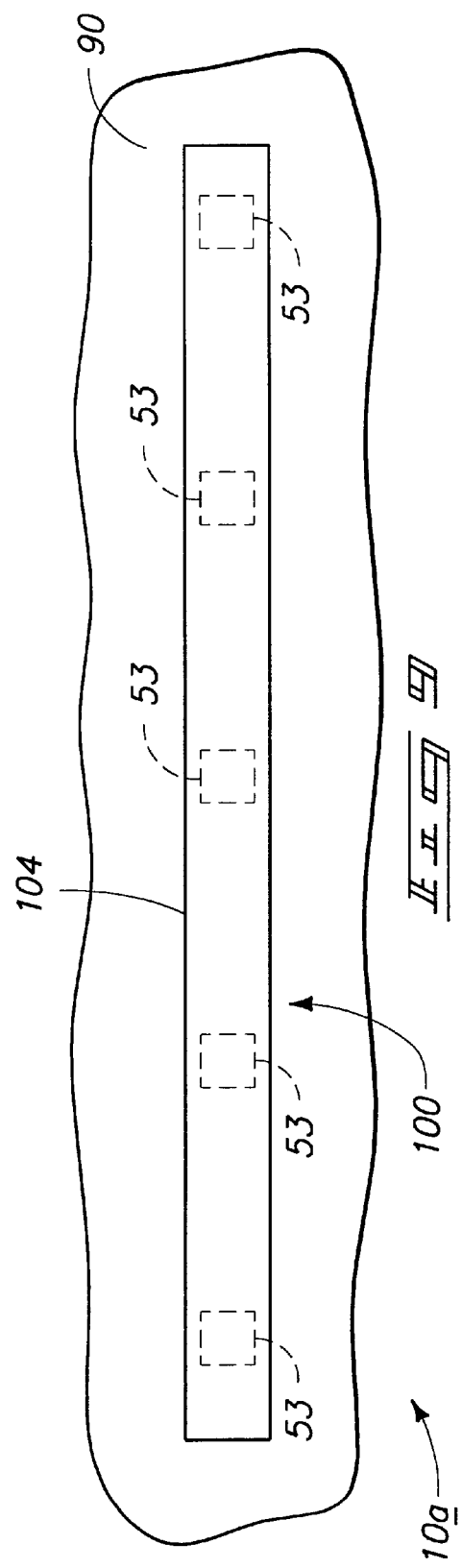

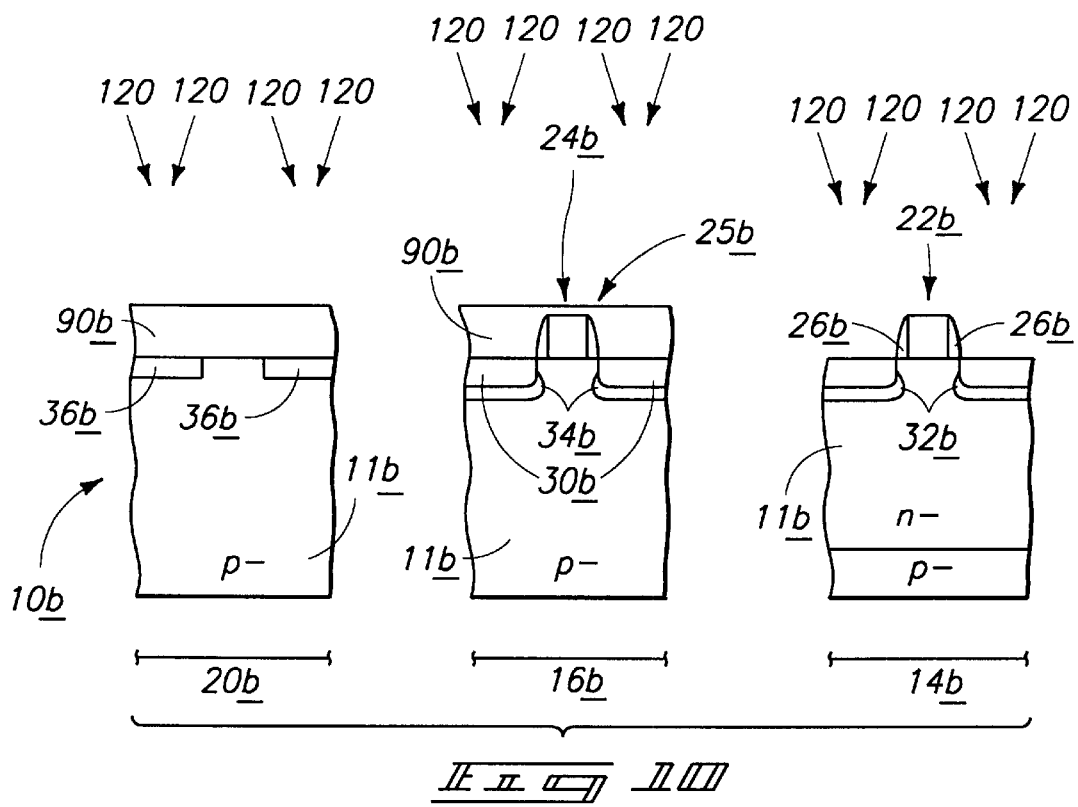
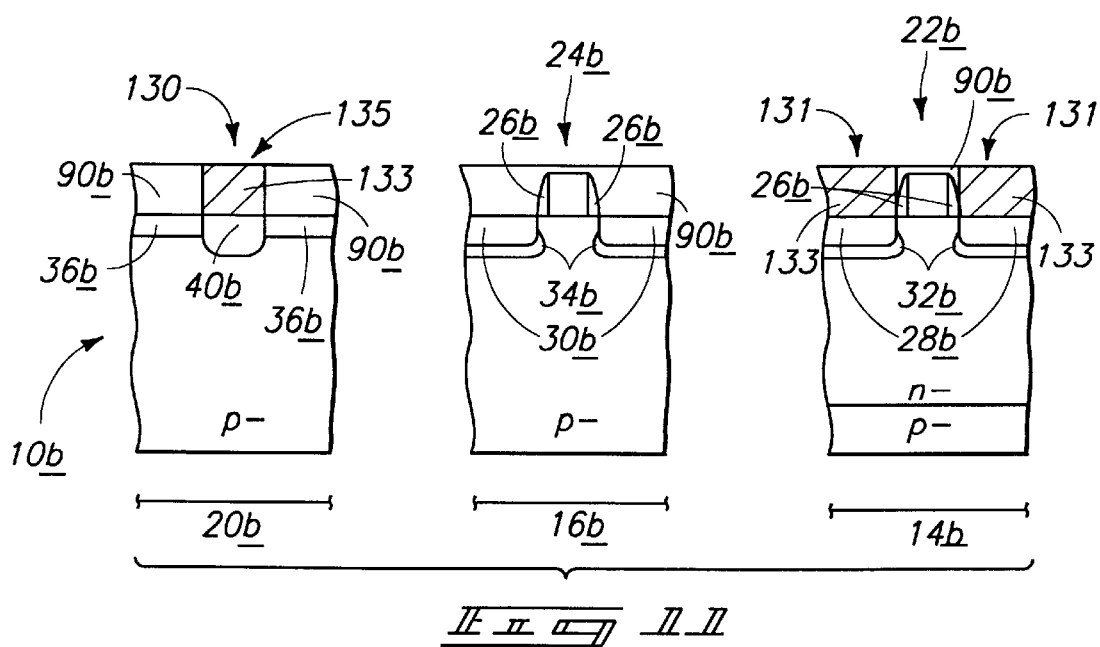

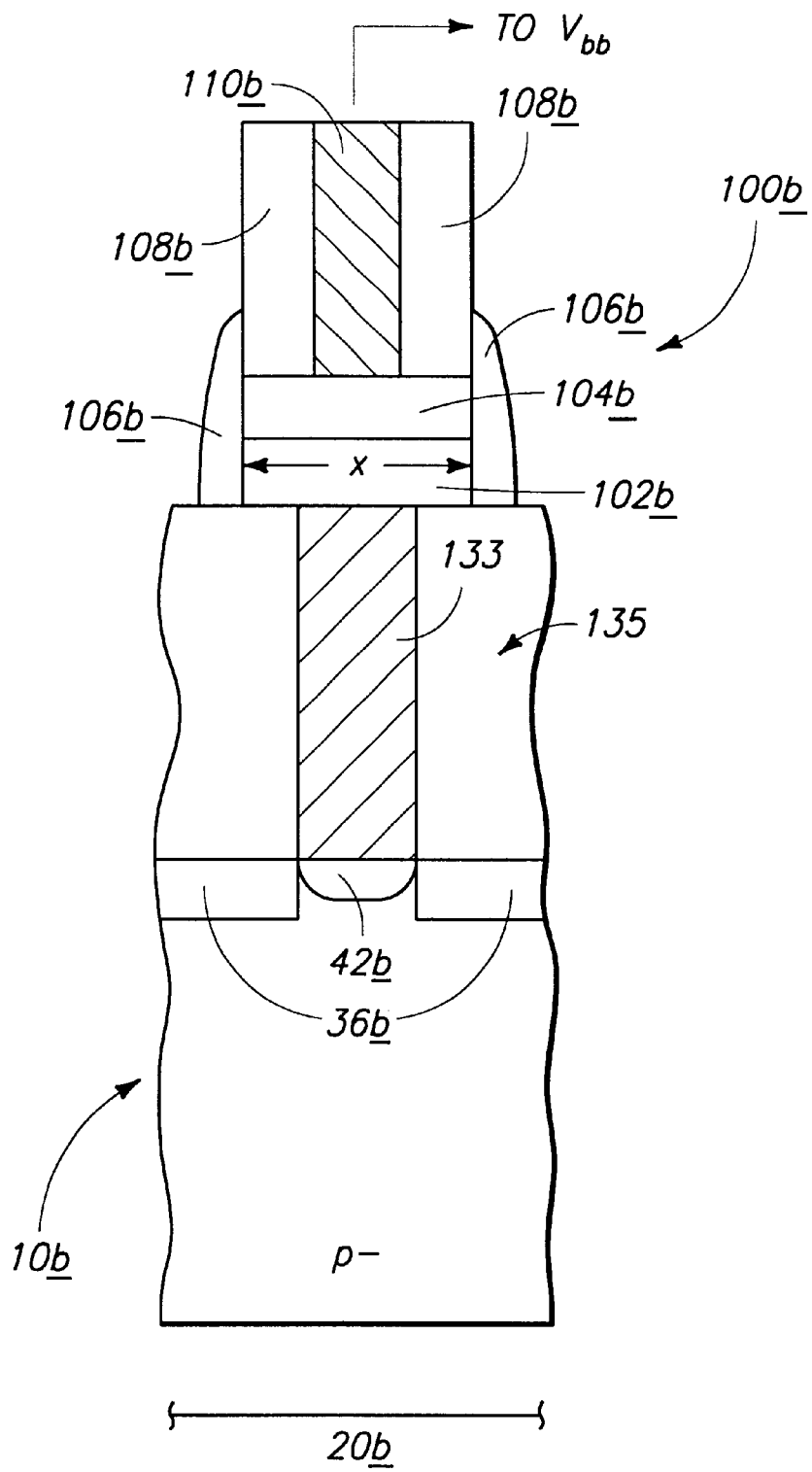

US 6,406,954 B1

METHOD FOR FORMING OUT-DIFFUSING A DOPANT FROM THE DOPED POLYSILICON INTO THE N-TYPE AND P-TYPE DOPED PORTION

TECHNICAL FIELD

The invention pertains to semiconductor processing methods wherein dopant is out-diffused into both n-type and p-type doped regions of a semiconductive material. In particular aspects, the invention pertains to methods of forming n-well and p-well contacts.

BACKGROUND OF THE INVENTION

Modern semiconductive processing methods frequently involve formation of n-type diffusion regions and p-type diffusion regions in a semiconductive material, as well as formation of transistors associated with the n-type diffusion regions and p-type diffusion regions. Monocrystalline silicon wafers are commonly utilized as semiconductive substrates, with the wafers generally being lightly background doped with p-type conductivity-enhancing dopant. At various regions within a wafer, an n-type conductivity-enhancing dopant can be implanted to a concentration which overwhelms the p-type dopant to thereby form n-wells. In other regions of the wafer the n-type dopant is not implanted, and such other regions remain as p-type regions (which can be referred to as p-wells).

Complementary metal-oxide semiconductors (CMOS) can be formed utilizing the n-wells and p-wells of the semiconductive wafer. Specifically, the n-wells are utilized for formation of p-channel metal-oxide semiconductor (PMOS) field effect transistors, and the p-wells are utilized for formation of n-channel metal-oxide semiconductor (NMOS) field effect transistors. In particular constructions, the n-well is generally held to $V_{cc}$ through a tie-down contact, and the p-well to $V_{bb}$ through a tie-down contact. The CMOS is typically formed at the periphery of memory array circuitry, and accordingly is referred to as peripheral circuitry.

A peripheral circuitry fragment 10 is shown and described with reference to FIG. 1. More specifically, fragment 10 comprises a semiconductor substrate 11, having a peripheral region 12. Peripheral region 12 comprises a PMOS transistor region 14 (also called a PMOS region), NMOS transistor region 16 (also called an NMOS region), n-well tie-down region 18, and p-well tie-down region 20. It is noted that PMOS transistor region 14 and n-well tie-down region 18 are comprised by an n-well (i.e., a lightly n-type doped region) of a semiconductor substrate, whereas NMOS transistor region 16 and p-well tie-down region 20 are comprised by a p-well (i.e., a lightly p-type doped region) of the semiconductor substrate.

To aid in interpretation of this disclosure and the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Generally, the substrate will comprise a semiconductive material, such as, for example, monocrystalline silicon, lightly doped with a background p-type dopant. Accordingly, p-well regions comprise portions of the substrate simply containing the background dopant, and n-well regions comprise portions of the substrate wherein n-type conductivity-enhancing dopant is provided to a concentration sufficient to overwhelm the background p-type doping. The background p-type doping can be provided to a concentration of, for example, from about $1 \times 10^{15}$ atoms/cm$^3$ to about $5 \times 10^{15}$ atoms/cm$^3$, and the n-type dopant provided to form the n-wells can be provided to a concentration of, for example, about $1 \times 10^{16}$ atoms/cm$^3$.

Transistor gates 22 and 24 are formed over PMOS transistor region 14 and NMOS transistor region 16, respectively. Transistor gates 22 and 24 can comprise, for example, a stack of polysilicon and silicide over gate oxide.

Sidewall spacers 26 are provided adjacent the gate stacks. Sidewall spacers 26 generally comprise insulative materials, such as, for example, silicon dioxide or silicon nitride.

Heavily doped p-type source/drain regions 28 are provided proximate gate 22, and heavily doped n-type source/drain regions 30 are provided proximate gate 24 (with the term "heavily doped" meaning a dopant concentration of greater than or equal to $10^{19}$ atoms/cm$^3$. Also, n-type halo regions 32 are provided adjacent PMOS source/drain regions 28, and p-type halo regions 34 are provided adjacent NMOS source/drain regions 30. LDD regions (not shown) would also typically be provided proximate one or both of transistor gates 22 and 24.

Transistor gate 24 and the diffusion regions proximate thereto define an NMOS transistor 25, and transistor gate 22 and the diffusion regions proximate thereto define a PMOS transistor 27.

Trench isolation regions 36 and 38 are provided within p-well tie-down region 20 and n-well tie-down region 18, respectively. Isolation regions 36 and 38 can comprise, for example, shallow trench isolation regions, with the shallow trenches being filled with silicon dioxide. A heavily doped p-type diffusion region 40 is formed within p-well tie-down region 20, and a heavily n-type doped diffusion region 42 is formed within n-well tie-down region 18. Regions 40 and 42 define a p-well tie-down node and an n-well tie-down node, respectively. The tie-down regions are formed at the same time as the source/drain regions for devices, and are formed using the same masks and implants.

An insulative material 44 extends over regions 14, 16, 20 and 18. Material 44 can comprise, for example, a stack of borophosphosilicate glass (BPSG) on an oxide (which functions as a barrier). Openings extend through insulative material 44 to diffusion regions 28, 30, 40 and 42 (only portions of the openings over regions 28 and 30 are shown), and a conductive material 46 is formed within such openings to form electrical contact to the underlying diffusion regions. The material 46 in the n-well and p-well tie-down regions 18 and 20 forms conductive plugs 47 and 49, respectively. Conductive material 46 can comprise, for example, a metal (such as tungsten or aluminum), with a liner (an exemplary liner is TiN).

Conductive material 46 is also used to contact other transistors (not shown). In the case of the p-well tie-down and n-well tie-down, $V_{bb}$ and $V_{cc}$ interconnections 50 and 52, respectively, are formed over and in electrical contact with conductive material 46 to connect the wells to their power supplies (not shown).

A problematic aspect of the assembly described with reference to FIG. 1 is that a p-type region 54 has been formed within n-well tie-down region 18. P-type region 54 was formed when halo regions 34 were generated (as described below with reference to FIGS. 2–3), and forms a diode between n-type diffusion region 42 and an underlying n-well. Such diode can adversely affect electrical connection between conductively doped region 42 and the underlying n-well, and can thus adversely affect operation of an n-well tie-down.

A prior art method of forming NMOS transistor 25 and the n-well tie-down is described below with reference to FIGS. 2 and 3. Referring initially to FIG. 2, transistor gate 24 and spacers 26 have been formed over NMOS region 16, and mask material 41 (typically photoresist) has been formed over n-well tie-down region 18. Further, an opening 60 has been formed through material 41 to expose underlying substrate 11 in the n-well region. A p-type dopant 62 is angle implanted into regions 16 and 18 to form diffusion regions 34 and 54.

Also shown in FIG. 2 is an n-type dopant 68 being implanted into regions 16 and 18 to form NMOS source/drain regions 30 and n-well tie-down 42. It is noted that the p-type implant, when done after provision of spacers, can be placed inside the n-type doped region or deeper, but after diffusion due to heat steps will likely end up deeper than an $n^+$ region because of the faster diffusion of boron (a common p-type dopant) than the n-type dopants. For instance, FIG. 3 illustrates wafer fragment 10 after it has been subjected to thermal processing. Such thermal processing diffuses the p-type dopant ahead of the n-type dopant. It would be desirable to develop alternative methods of forming n-well type tie-down regions which avoid the formation of p-type diffusion regions within the n-well tie-down.

SUMMARY OF THE INVENTION

In one aspect, the invention includes a semiconductor processing method. A semiconductive material is provided. The semiconductive material has a first portion and a second portion. The first portion is a p-type doped portion and the second portion is an n-type doped portion. A mask material is formed over the p-type and n-type doped portions. A first opening is formed to extend through the mask material and to the n-type doped region. A second opening is formed to extend through the mask material and to the p-type doped region. Conductively doped polysilicon is formed within the first and second openings. Dopant is out-diffused from the conductively-doped polysilicon and into the n-type and p-type doped portions.

In another aspect, the invention includes a method of forming a CMOS construction. A semiconductive material is provided. The semiconductive material has a first portion and a second portion. The first portion is a p-type doped portion and the second portion is an n-type doped portion. A PMOS transistor location of the second portion is defined, an n-well tie-down location of the second portion is defined, and an NMOS transistor location of the first portion is defined. A first transistor gate is formed over the NMOS transistor location of the first portion, and a second transistor gate is formed over the PMOS transistor location of the second portion. A mask material is formed over the semiconductive material. The mask material covers the n-well tie-down location and PMOS transistor location of the second portion. The mask material has a first opening extending therethrough to the NMOS transistor location of the first portion, and p-type dopant is implanted through the first opening and into the NMOS transistor location. A second opening is formed to extend through the mask material and to the n-well tie-down location. Polysilicon (which is heavily doped with an n-type dopant) is provided within the first and second openings. N-type dopant is out-diffused from the conductively-doped polysilicon into both the n-well tie-down location and the NMOS transistor location.

BRIEF DESCRIPTION OF THE DRAWINGS

Preferred embodiments of the invention are described below with reference to the following accompanying drawings.

FIG. 8 is a fragmentary top view of a wafer fragment shown at a step after the processing of FIG. 7, and at a different scale than the view of FIG. 7.

FIG. 9 is a fragmentary top view of a wafer fragment shown at a step after the processing step of FIG. 7, and at the scale of FIG. 8. The processing of FIG. 9 can be utilized in addition to, or alternatively to, that of FIG. 8.

FIG. 10 is a diagrammatic, fragmentary, cross-sectional view of a semiconductive wafer fragment processed according to a second embodiment method of the present invention.

FIG. 11 is a view of the FIG. 10 wafer fragment shown at a processing step subsequent to that of FIG. 10.

FIG. 13 is a view of a portion of the FIG. 10 wafer fragment shown at a processing step subsequent to that of FIG. 12.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
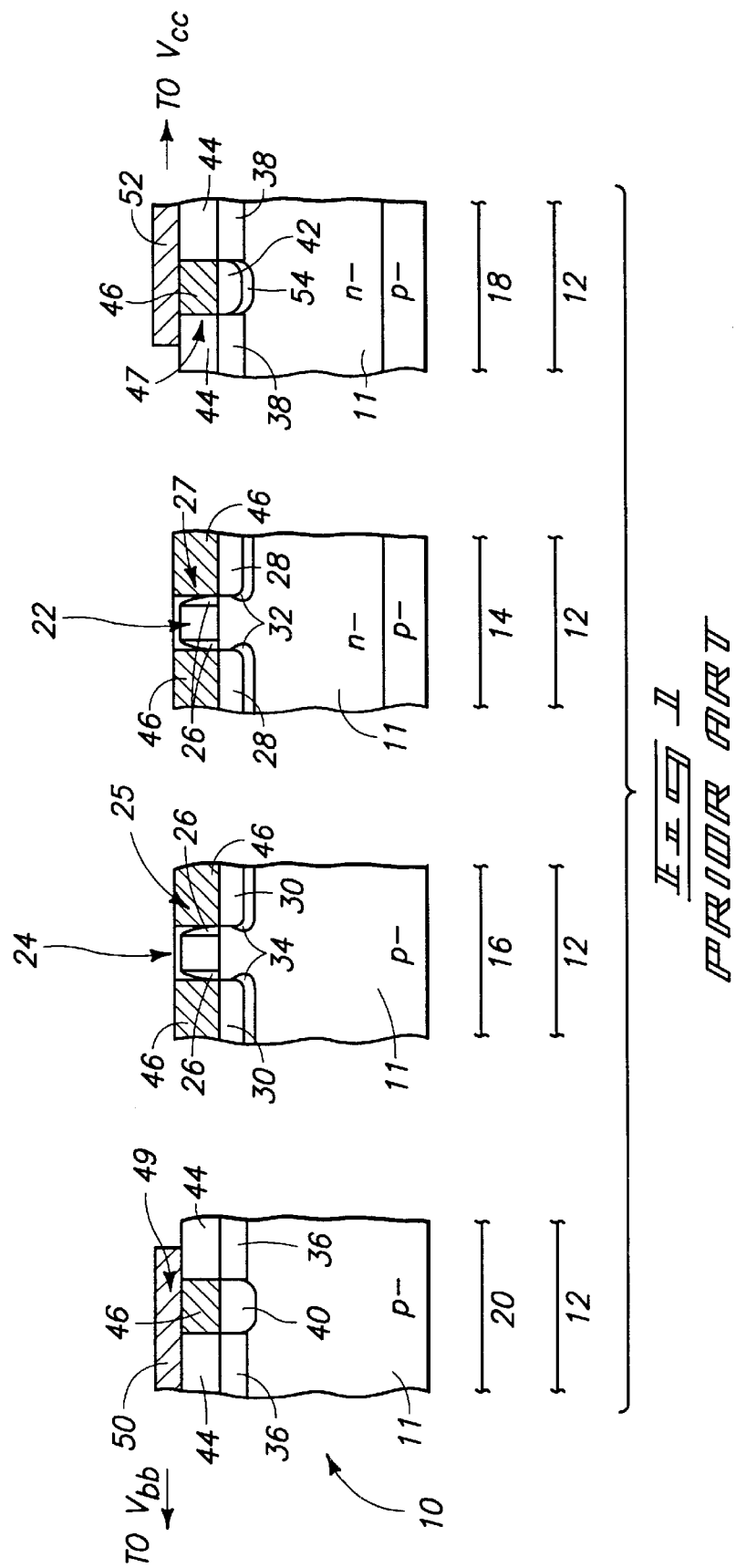
FIG. 1 is a fragmentary, diagrammatic view of a semiconductive material wafer processed according to a method of the prior art.
Figure 2:
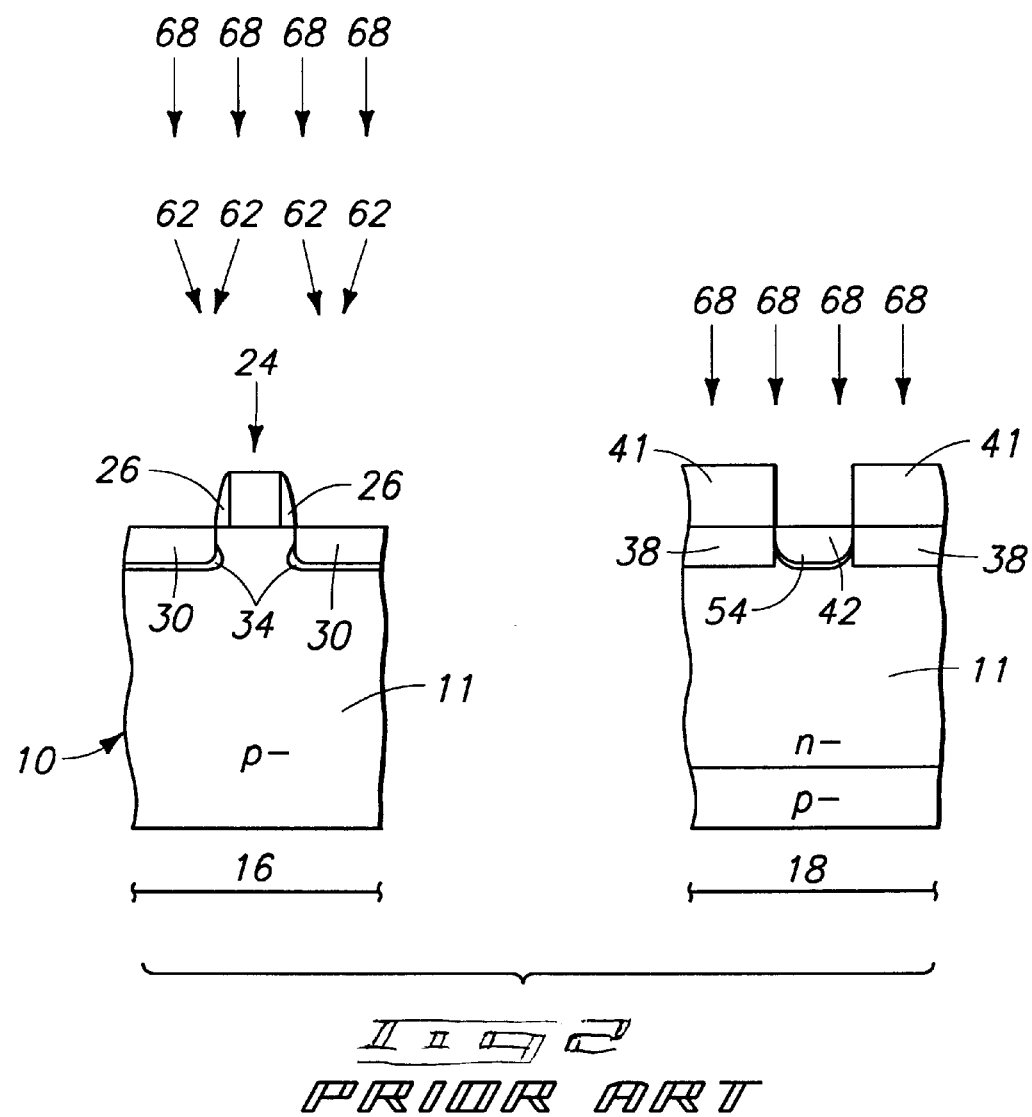
FIG. 2 is a view of the wafer fragment of FIG. 1 shown at a prior art processing step utilized in fabricating the structure of FIG. 1.
Figure 3:
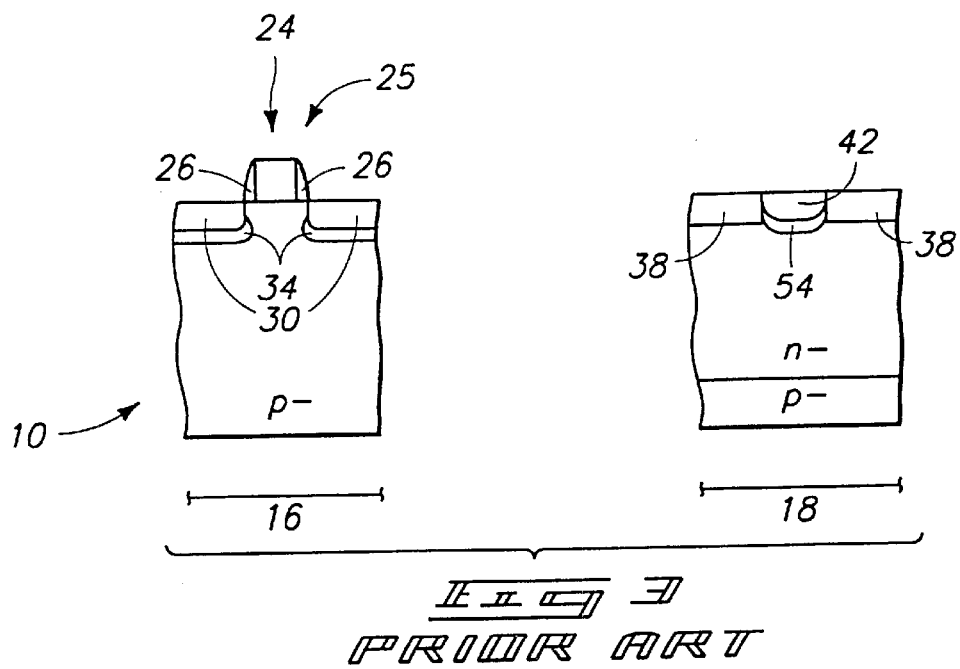
FIG. 3 is a view of the FIG. 2 wafer fragment shown at a prior art processing step subsequent to that of FIG. 2.

A method of the present invention is described with reference to FIGS. 4–7. In referring to FIGS. 4–7, similar numbering to that utilized above in describing the prior art of FIGS. 1–3 will be used, with the suffix "a" utilized to indicate structures pertaining to the embodiment of FIGS. 4–7.

Figure 4:
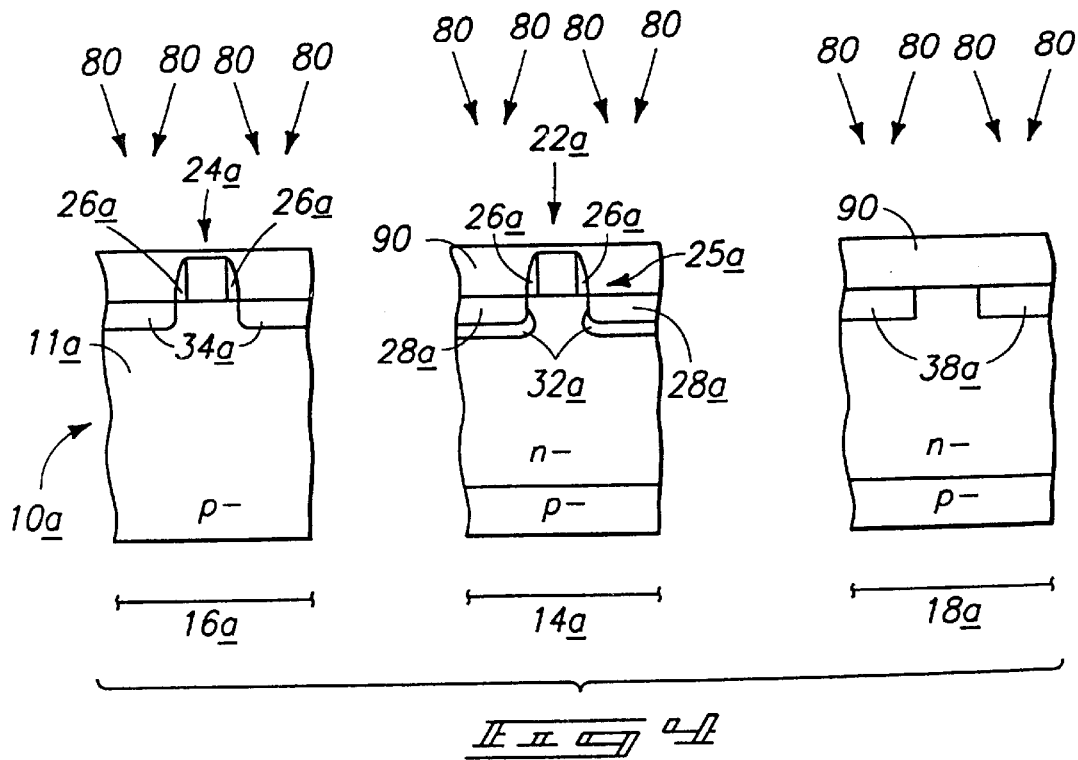
FIG. 4 is a diagrammatic, fragmentary, cross-sectional view of a semiconductor wafer fragment processed according to a method of the present invention.

Referring to FIG. 4, a semiconductor wafer fragment 10a comprises an NMOS region 16a, a PMOS region 14a, and an n-well tie-down region 18a. Semiconductor wafer fragment 10a can further comprise a p-well tie-down region (not shown). FIG. 4 can comprise a portion of wafer 10a which is peripheral to memory array circuitry.

A PMOS transistor structure 25a has been formed over PMOS region 14a. Transistor structure 25a comprises a gate 22a, sidewall spacers 26a, source/drain regions 28a, and halo regions 32a. Transistor structure 25a can comprise, for example, a structure identical to the structure 25 described above with reference to the prior art.

A mask material 90 has been formed over structure 25a. Mask material 90 can be photoresist, or insulative materials such as BPSG, silicon dioxide or silicon nitride. If mask material 90 is an insulative material, such mask material can remain in a completed structure analogously to the insulative material 44 of FIG. 1. It is noted that the numeral 90 is utilized to label mask materials throughout the Figures of the application. It is to be understood, however, that such utilization of the common numeral 90 merely indicates that the layers are all mask layers, and not that they are the same mask layer. As will be recognized by persons of ordinary skill in the art, mask layers can be formed, stripped, and reformed numerous times during semiconductor processing. Accordingly, the masking layer shown at one step of a process can be different than a masking layer shown at the same location in a different step of the process. Specifically, the masking layer can be an easily formed and removed material (like photoresist) at early steps of a process, and be replaced with a more durable material (like BPSG) at later steps of the process. Further, a particular mask layer (like BPSG) can be patterned with another mask layer (like photoresist). In a preferred embodiment, material 90 is BPSG which has been planarized by chemical-mechanical polishing, and patterned with photoresist (to form the openings which extend through material 90).

Mask material 90 extends over n-well tie-down region 18a and isolation regions 38a. Isolation regions 38a can comprise, for example, shallow trench isolation regions of the type described above with reference to the prior art.

A transistor gate 24a and sidewall spacers 26a have been formed over NMOS region 16a. After the formation of gate 24a and sidewall spacers 26a, a p-type dopant 80 is implanted into semiconductive wafer 11a to form NMOS transistor halo regions 34a. Dopant 80 is implanted at an angle to force the dopant under sidewall spacers 26a and toward a channel region under gate 24a. Mask material 90 protects regions 14a and 18a from having dopant 80 implanted therein.

Figure 5:
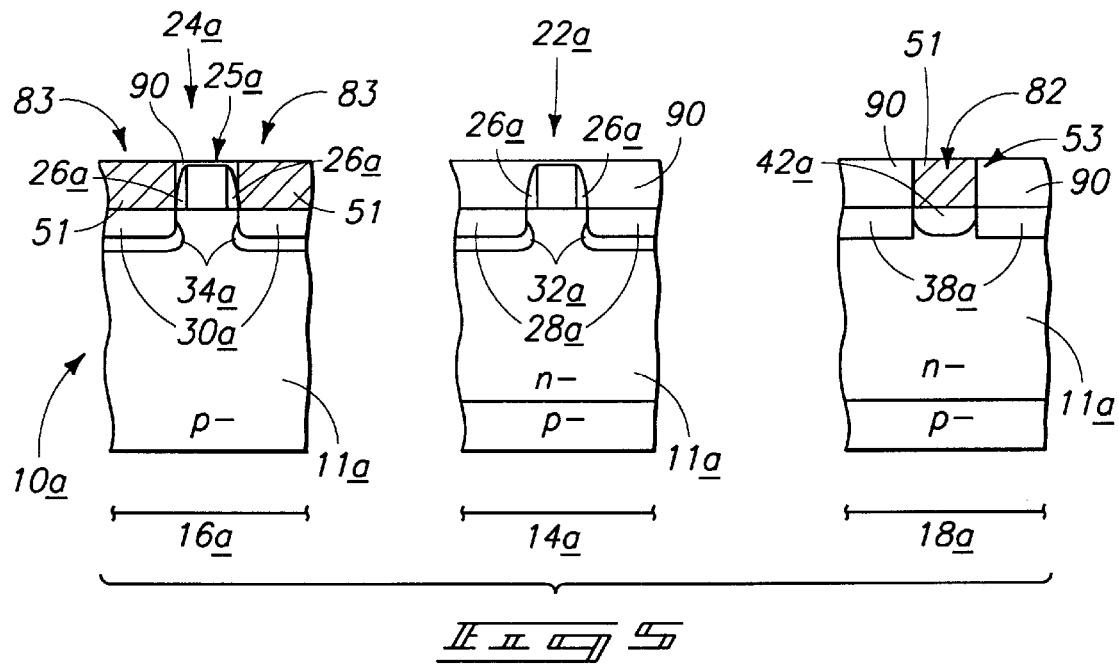
FIG. 5 is a view of the FIG. 4 wafer fragment shown at a processing step subsequent to that of FIG. 4.

Referring to FIG. 5, mask material 90 is formed over NMOS region 16a. Subsequently, an opening 82 is formed within mask material 90 over n-well tie-down region 18a, and openings 83 are formed over NMOS region 16a (only portions of the openings are shown). A conductively doped polysilicon material 51 is formed within openings 82 and 83, and preferably completely fills such openings. The material 51 within opening 82 defines a conductive plug 53.

Preferably, conductively doped polysilicon 51 is doped to a concentration of at least $1 \times 10^{19}$ atoms/cm$^3$ with an n-type dopant (such as phosphorus). Subsequent thermal processing (such as subjecting fragment 10a to two rapid thermal processing (RTP) steps to 950° C. for 20 seconds, and further subjecting the fragment to 750° C. for 30 minutes in an anneal) out-diffuses dopant from doped polysilicon 51 to form NMOS source/drain regions 30a, and to form n-well tie-down node 42a. Note that since opening 82 is formed after the implant of p-type dopant into wafer 11a, there is no p-type doped region analogous to region 54 (FIG. 1) in wafer fragment 10a of FIG. 5.

Figure 6:
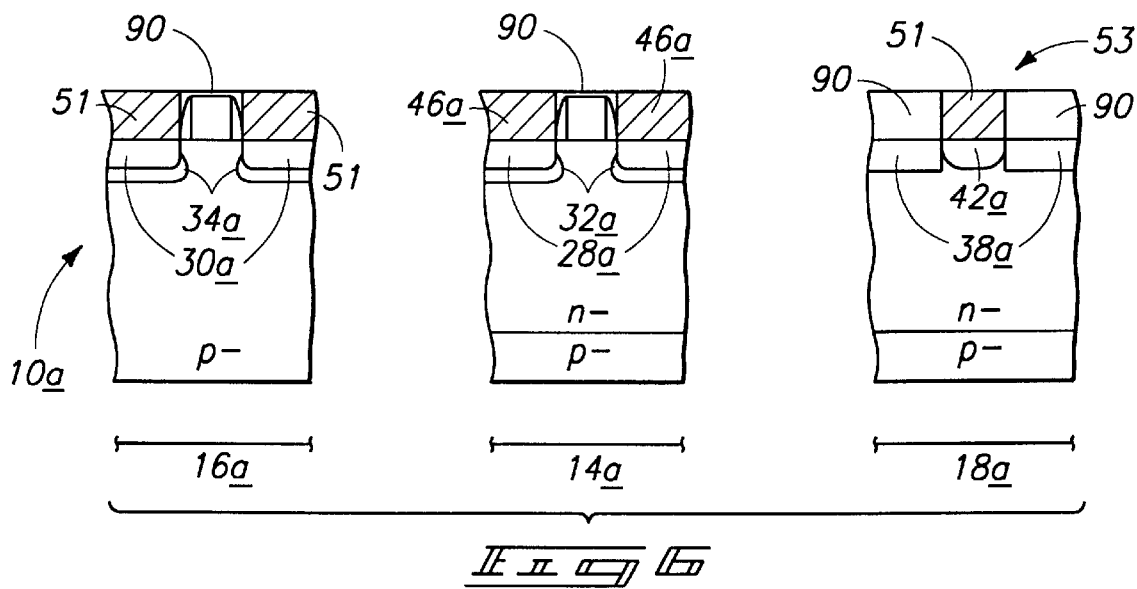
FIG. 6 is a view of the FIG. 4 wafer fragment shown at a processing step subsequent to that of FIG. 5.

Referring to FIG. 6, openings are formed over PMOS region 14a and filled with conductive material 46a to form electrical contacts to source/drain regions 28a. Conductive material 46a can comprise, for example, a metal of the type described with reference to material 46 of the prior art. After formation of material 46a, wafer 10a can be subjected to polishing to planarize an upper surface of materials 90, 46a and 51. Such polishing can comprise, for example, chemical-mechanical polishing.

After the processing of FIG. 6, further processing can be conducted to form electrical connections between conductive plug 53 and other circuitry (not shown). Such further processing can include formation of an interconnect analogous to interconnect 52 (described above with reference to FIG. 1) to connect plug 53 with $V_{cc}$ circuitry.

Figure 7:
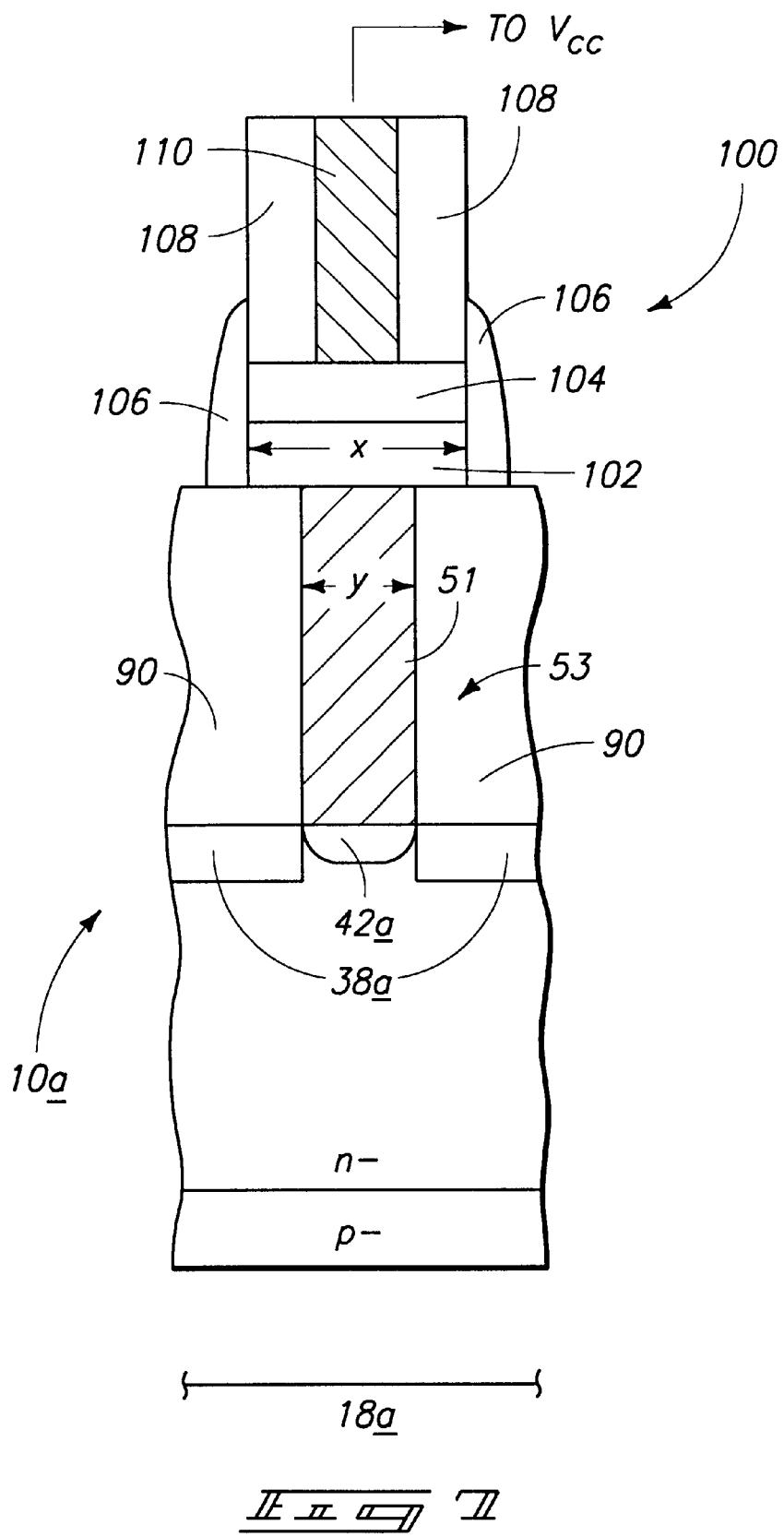
FIG. 7 is a view of the FIG. 4 wafer fragment shown at a processing step subsequent to that of FIG. 6.

An alternative method of electrically connecting conductive plug 53 with $V_{cc}$ circuitry is described with reference to FIG. 7. Specifically, FIG. 7 shows a stack 100 formed over mask material 90 and plug 53. Stack 100 comprises a layer 102 of conductively doped polysilicon and a layer 104 of metal suicide. One exemplary metal silicide being titanium silicide. Polysilicon layer 102 is in electrical contact with conductive material 51, and silicide layer 104 is in electrical contact with conductively doped layer 102. Layers 102 and 104 comprise a width "x" which is wider than a width "y" of conductive material 51. Accordingly, layers 102 and 104 constitute a landing pad for electrical connection to material 51 which is wider than is a portion of material 51 exposed for electrical connection. Materials 102 and 104 can thus compensate for mask misalignment when forming an electrical connection to plug 53.

Insulative sidewalls 106 are formed adjacent layers 102 and 104, and an insulative cap 108 is formed over layer 104. Sidewalls 106 and cap 108 can comprise, for example, silicon nitride or silicon dioxide. An opening is etched through cap 108 to silicide 104, and subsequently such opening is filled with a conductive material 110. Conductive material 110 can subsequently be connected to $V_{cc}$ to accordingly enable electrical connection through material 110, layers 104 and 102, and material 51 from node 42a to $V_{cc}$. Material 110 can comprise, for example, a metal, or conductively doped polysilicon.

FIGS. 8 and 9 illustrate top views of separate embodiments of the structures shown in FIG. 7. The views of FIGS. 8 and 9 are at a different scale than that of FIG. 7, and prior to formation of sidewalls 106 or an opening within cap 108 for provision of conductive material 110.

FIG. 8 shows stacks 100 across a top of wafer fragment 10a and physically separated from one another. Conductive plugs 53 are shown in phantom view beneath stacks 100.

FIG. 9 illustrates an alternative example, wherein a single long conductive stack 100 is formed to overlie a plurality of n-well contact plugs 53.

The processing described above with reference to FIGS. 4–9 forms n-well tie-down nodes and NMOS source/drain regions in a common doping step. It is to be understood, however, that the invention can also be utilized for forming p-well tie-down nodes and PMOS source/drain regions in a common doping step. An exemplary method of utilizing the present invention to form PMOS source/drain regions and p-well tie-down nodes in a common doping step is described with reference to FIGS. 10–13. In referring to FIGS. 10–13, similar numbering will be utilized as was used in describing the prior art of FIGS. 1–3 and the embodiment of FIGS. 4–9, with the suffix "b" utilized to indicate structures pertaining to the embodiment of FIGS. 10–13.

Referring to FIG. 10, a wafer fragment 10b comprises a semiconductive material substrate 11b divided into a p-well tie-down region 20b, an NMOS region 16b, and a PMOS region 14b. An NMOS transistor 25b is formed over NMOS region 16b and comprises source/drain regions 30b, halo regions 34b and a transistor gate 24b.

Isolation regions 36b are formed within substrate 11b of p-well tie-down region 12b. Isolation regions 36b can comprise, for example, shallow trench isolation regions containing silicon dioxide. A mask material 90b is provided over regions 20b and 16b.

A transistor gate 22b is provided over PMOS region 14b of fragment 10b, and spacers 26b are provided adjacent gate 22b. After formation of gate 22b and spacers 26b, n-type dopant 120 is implanted into fragment 10b to form PMOS transistor halo regions 32b proximate gate 22b. N-type dopant 120 is implanted at an angle to force the dopant under spacers 26b and toward a channel region beneath gate 22b.

Referring to FIG. 11, mask material 90b is formed over PMOS region 14b. An opening 130 is formed within material 90b over p-well tie-down region 20b, and openings 131 (only portions of which are shown) are formed over region 14b. Conductively doped polysilicon 133 is formed within openings 130 and 131, and preferably completely fills such openings. Polysilicon 133 is preferably doped with a p-type material (such as boron) to a concentration of at least $1 \times 10^{19}$ atoms/cm$^3$. Subsequent thermal processing (such as subjecting fragment 10a to two RTP steps to 950° C. for 20 seconds, and further subjecting the fragment to 750° C. for 30 minutes in an anneal) out-diffuses dopant from doped polysilicon 133 to form p-well tie-down node 40b and PMOS source/drain regions 28b.

Figure 12:
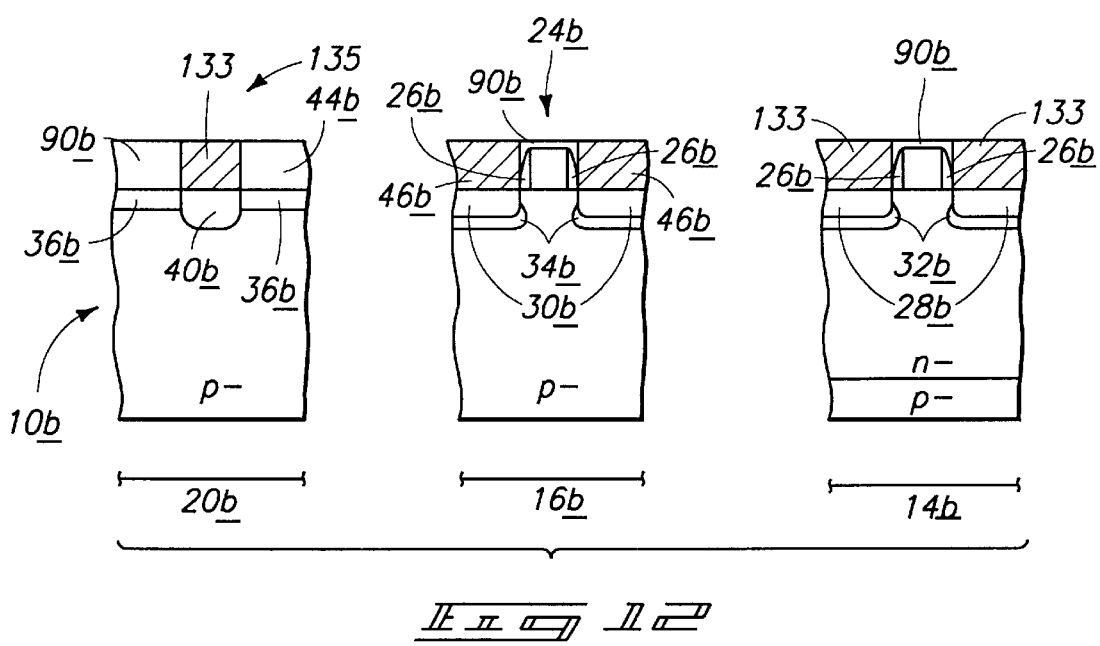
FIG. 12 is a view of the FIG. 10 wafer fragment shown at a step subsequent to that of FIG. 11.

Referring to FIG. 12, openings are formed through the mask material over region 16b and filled with conductive material 46b. Conductive material 46b can comprise, for example, a metal of the type described with reference to material 46 of the prior art. After formation of material 46b, wafer 10b can be subjected to polishing to planarize an upper surface of materials 90b, 46b and 133. Such polishing can comprise, for example, chemical-mechanical polishing.

Plug 135 can be connected to $V_{bb}$ utilizing methodologies described above with reference to the prior art, or can be connected utilizing a stack analogous to the structure 100 of FIG. 7. FIG. 13 illustrates a stack 100b utilized to connect interconnect 135 to $V_{bb}$. Stack 100b comprises a polysilicon layer 102b, a silicide layer 104b and sidewalls 106b. Stack 100b further comprises an insulative cap 108b, and a conductive interconnect 110b extending through cap 108b to electrically connect with silicide 104b. Conductive material 110b connects to $V_{bb}$.

The structures and methods described herein are exemplary features of the present invention. The invention, of course, encompasses other structures and methods besides those embodiments specifically described. For instance, in the methodology of FIGS. 4–7 the PMOS halo and source/drain regions were provided before any diffusion regions were provided within the NMOS region of the substrate. In other embodiments of the invention, the PMOS halo and source/drain regions could be provided after forming some or all of the NMOS diffusion regions. Further, in the structures described above NMOS LDD regions and PMOS LDD regions are not shown. Of course, the structures described above could encompass one or both of NMOS LDD regions and PMOS LDD regions. Additionally, in describing the methodologies of FIGS. 10–13, the NMOS halo regions and NMOS source/drain regions are shown formed before any diffusion regions are formed within the PMOS region. In other embodiments of the invention, one or more of the NMOS source/drain regions and NMOS halo regions can be formed after diffusion regions are provided within the PMOS region of the substrate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:
    providing a semiconductive material having a first portion being a p-type doped portion and the second portion being an n-type doped portion;
    forming masking material over the p-type doped portion and n-type doped portion;
    first forming a first opening extending through the masking material and to one of the n-type doped portion or p-type doped portion;
    second forming a second opening extending through the mask material and to another of the n-type doped portion or p-type doped portion;
    forming in a common step, conductively doped polysilicon within the first and second openings, the conductively doped polysilicon forming a tie-down to at least one of the n-type doped portion or p-type doped portion;
    out-diffusing a dopant from the conductively doped polysilicon into the n-type doped portion and p-type doped portion;
    when the conductively doped polysilicon in the first or the second opening is a tie-down to the n-type doped portion, electrically connecting the conductively doped polysilicon to $V_{cc}$; and
    when the conductively doped polysilicon in the first or the second opening is a tie-down to the p-type doped portion, electrically connecting the conductively doped polysilicon to $V_{bb}$.

2. The method of claim 1 wherein the semiconductive material is a monocrystalline silicon wafer.

3. The method of claim 1 wherein the conductively doped polysilicon is doped to at least $1 \times 10^{19}$ atoms/cm$^3$ with n-type dopant.

4. The method of claim 1 wherein the conductively doped polysilicon is doped to at least $1 \times 10^{19}$ atoms/cm$^3$ with p-type dopant.

5. The method of claim 1 wherein the conductively doped polysilicon is doped to at least $1 \times 10^{19}$ atoms/cm$^3$ with one of a p-type dopant or an n-type dopant, and further comprising:
    before forming the masking material, forming an NMOS transistor gate configured to utilize the p-type doped portion as a channel region when the doped polysilicon is n-type, or forming a PMOS transistor gate configured to utilize the n-type doped portion as a channel region when the doped polysilicon is p-type; and
    wherein when the doped polysilicon is n-type, the n-type dopant is the dopant out-diffused from the conductively-doped polysilicon, the out-diffused dopant forming n-type source and drain regions proximate the NMOS transistor gate and forming an n-well tie-down node within the n-type doped portion or when the doped polysilicon is p-type, the p-type dopant is the dopant out-diffused from the conductively-doped polysilicon, the out-diffused dopant forming p-type source and drain regions proximate the PMOS transistor gate and forming a p-well tie-down node within the p-type doped portion.

6. The method of claim 5 wherein the conductively doped polysilicon completely fills the first and second openings.

7. A method of forming a CMOS construction comprising:
   providing a semiconductive material having one or more p-type doped portions and one or more n-type doped portions;
   forming an NMOS transistor gate over at least one of the p-type portions and a PMOS transistor gate over at least one of the n-type portions;
   forming masking material over the one or more p-type doped portions and the one or more n-type doped portions;
   forming a first opening extending through the masking material and to at least one of the p-type doped portions, when the portions include a transistor gate formed thereover, the opening being laterally proximate the masked transistor gate;
   forming a second opening extending through the masking material and to at least one of the n-type doped portions, when the portions include a transistor gate formed thereover, the opening being laterally proximate the masked transistor gate;
   simultaneously forming conductively doped polysilicon within the first and second openings; and
   out-diffusing dopant from the conductively-doped polysilicon into the p-type doped portion and the n-type doped portion, the out diffusing forming a tie-down in one of first opening or the second opening.

8. The method of claim 7 wherein the conductively doped polysilicon is doped to at least $1 \times 10^{19}$ atoms/cm$^3$ with n-type dopant.

9. The method of claim 7 wherein the conductively doped polysilicon is doped to at least $1 \times 10^{19}$ atoms/cm$^3$ with p-type dopant.

10. The method of claim 7 wherein the conductively doped polysilicon is doped to at least $1 \times 10^{19}$ atoms/cm$^3$ with n-type dopant; wherein the NMOS and PMOS transistor gates are formed before forming the masking material; and wherein the n-type dopant is the dopant out-diffused from the conductively-doped polysilicon, the out-diffused dopant forming source and drain regions proximate the NMOS transistor gates and forming an n-well tie-down node within at least one of the n-type doped portions.

11. The method of claim 10 wherein the conductively doped polysilicon completely fills the first and second openings.

12. The method of claim 7 wherein the conductively doped polysilicon is doped to at least $1 \times 10^{19}$ atoms/cm$^3$ with p-type dopant; wherein the NMOS and PMOS transistor gates are formed before forming the masking material; and wherein the p-type dopant is the dopant out-diffused from the conductively-doped polysilicon, the out-diffused dopant forming source and drain regions proximate the PMOS transistor gates and forming a p-well tie-down node within at least one of the p-type doped portions.

13. A method of forming a CMOS construction comprising:
   providing a semiconductive material having a first portion, a second portion and a third portion, the first portion being a p-type doped portion, the second portion being an n-type doped portion and the third portion being one of a p-type doped portion or an n-type doped portion;
   defining a tie-down location of the third portion, defining a PMOS transistor location of the second portion, and defining an NMOS transistor location of the first portion;
   forming a first transistor gate over the NMOS transistor location of the first portion and forming a second transistor gate over the PMOS transistor location of the second portion;
   forming a mask material over the semiconductive material;
   patterning the mask material to form a first opening exposing one of the NMOS transistor location or the PMOS transistor location;
   implanting dopant through the first opening and into the exposed transistor location to form halo implant regions proximate the exposed transistor gate;
   forming a second opening extending through the mask material and to the tie-down location;
   when the first opening exposes the PMOS transistor location, forming in a common step polysilicon doped with an p-type dopant within the first and second openings;
   when the first opening exposes the NMOS transistor location, forming in a common step polysilicon conductively doped with an n-type dopant within the first and second openings; and
   out-diffusing dopant from the conductively-doped polysilicon into the tie-down location and into the transistor location, the out-diffused dopant forming source and drain regions proximate the transistor gate a tie-down node within the tie-down location.

14. The method of claim 13 wherein the semiconductive material is a monocrystalline silicon wafer.

15. The method of claim 13 wherein the conductively doped polysilicon is doped to at least $1 \times 10^{19}$ atoms/cm$^3$ with the n-type dopant.

16. The method of claim 13 further comprising exposing one of an n-well tie-down region or a p-well tie-down and forming a stack over and in electrical connection with the polysilicon of the exposed tie-down, the stack comprising a layer of silicide over a layer of conductively doped polysilicon.

17. The method of claim 16 wherein the silicide comprises titanium silicide.

18. The method of claim 13 further comprising:
   exposing an n-well tie down region;
   forming a stack over and in electrical connection with the polysilicon of the n-well tie-down, the stack comprising a layer of silicide over a layer of conductively doped polysilicon; and
   forming a $V_{cc}$ interconnect to electrically connect a $V_{cc}$ line with silicide of the stack.

19. The method of claim 13 wherein the conductively doped polysilicon is doped to at least $1 \times 10^{19}$ atoms/cm$^3$ with the p-type dopant.

* * * * *

UNITED STATES PATENT AND TRADEMARK OFFICE
CERTIFICATE OF CORRECTION

PATENT NO. : 6,406,954 B1
DATED : June 18, 2002
INVENTOR(S) : Shubneesh Batra et al.

It is certified that error appears in the above-identified patent and that said Letters Patent is hereby corrected as shown below:

Column 6,
Line 17, replace "metal suicide. One exemplary metal silicide" with -- metal silicide. One exemplary metal silicide --

Signed and Sealed this

Fifteenth Day of April, 2003

JAMES E. ROGAN
*Director of the United States Patent and Trademark Office*